United States Patent [19]

Tasch, Jr. et al.

[11] 4,153,904

[45] May 8, 1979

[54] SEMICONDUCTOR DEVICE HAVING A HIGH BREAKDOWN VOLTAGE JUNCTION CHARACTERISTIC

[75] Inventors: Al F. Tasch, Jr., Richardson; Horng-Sen Fu; Pallab K. Chatterjee, both of Dallas, all of Tex.

[73] Assignee: Texas Instruments Incorporated, Dallas, Tex.

[21] Appl. No.: 838,779

[22] Filed: Oct. 3, 1977

[51] Int. Cl.² .......................................... H01L 29/90
[52] U.S. Cl. ........................................ 357/13; 357/89; 357/90; 357/91
[58] Field of Search .................... 357/13, 89, 90, 91

[56] References Cited

U.S. PATENT DOCUMENTS

| | | | |
|---|---|---|---|
| 3,663,874 | 5/1972 | Fukukawa et al. | 357/13 |
| 3,814,997 | 6/1974 | Takahashi et al. | 357/13 |
| 3,914,781 | 10/1975 | Matsushita et al. | 357/13 |

Primary Examiner—Edward J. Wojciechowicz
Attorney, Agent, or Firm—Melvin Sharp; Richard L. Donaldson; William E. Hiller

[57] ABSTRACT

A semiconductor device having a p-n junction characterized by low electric field crowding and a resulting high avalanche breakdown voltage requirement. The semiconductor device is comprised of a semiconductor substrate having impurity atoms of one type and a first surface. A first doped region lies in said substrate at said first surface and has dopant atoms of a type opposite to said one type. A second doped region lies in said substrate at said first surface adjacent the entire perimeter of said first doped region. The second doped region extends laterally away from said first doped region, and has dopant atoms of the same type as and of less density than said dopant atoms of said first doped region.

14 Claims, 9 Drawing Figures

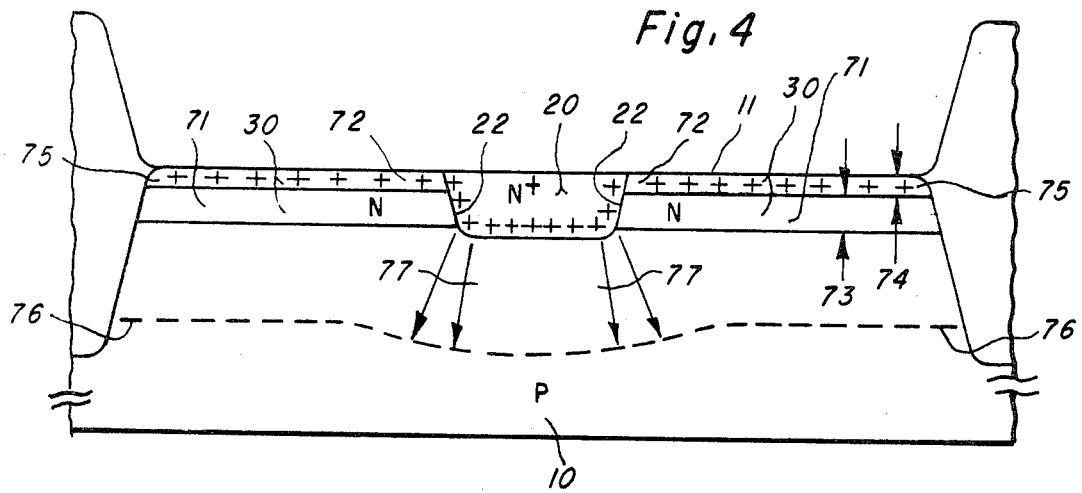
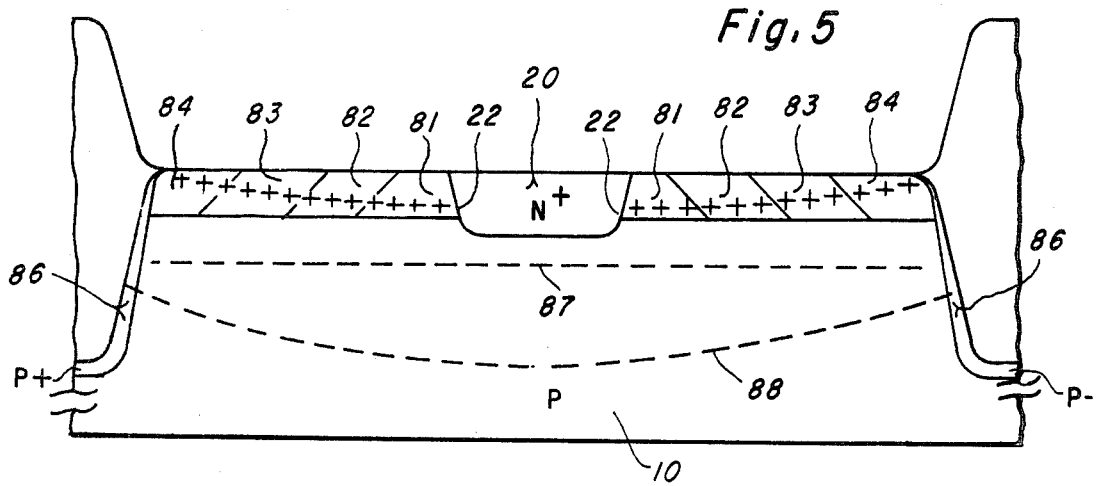
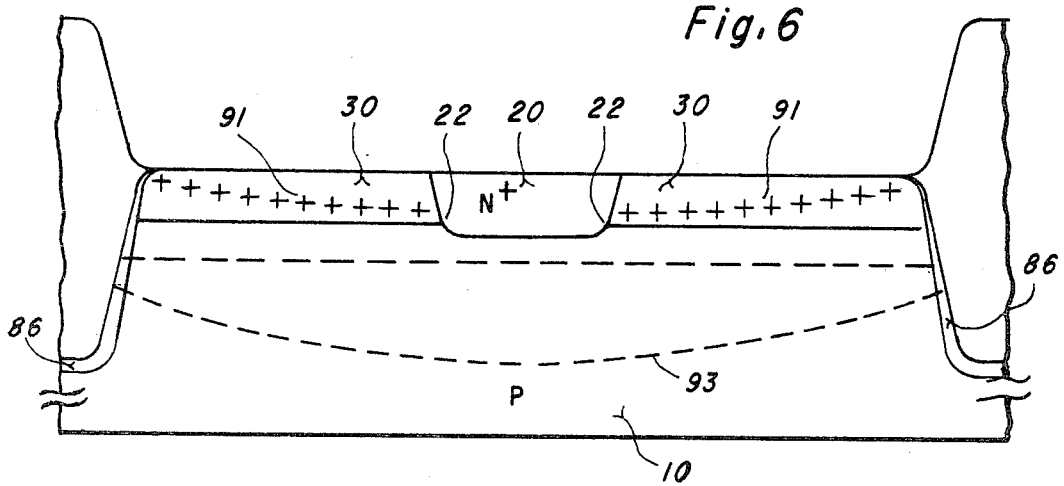

SEMICONDUCTOR DEVICE HAVING A HIGH BREAKDOWN VOLTAGE JUNCTION CHARACTERISTIC

BACKGROUND OF THE INVENTION

This invention relates to semiconductor junctions and more particularly to semiconductor devices having P-N junctions having a high avalanche breakdown voltage characteristic. The semiconductor devices are respectively comprised of a semiconductor substrate having impurity atoms of one type and having a first surface. A doped region lies in the substrate at the first surface and has dopant impurity atoms of a type opposite to the impurity atoms of the semiconductor substrate. For example, the substrate may have P-type impurity atoms, such as boron; while the doped region may be formed in the P-type substrate by N-type impurity atoms, such as phosphorus, arsenic or antimony. Typically, the doped region extends from the first surface into the substrate to one uniform depth of approximately 0.1–5.0u. The perimeter (i.e. sides) of the doped region extends from the first surface to the bottom of the doped region and has a curvature. This curvature is roughly approximated by a fixed radius. The curvature is important because the curved geometry causes electric field lines to crowd at the perimeter. Under a high reverse bias voltage, the electric field line crowding gives rise to an avalanche breakdown voltage that is lower than the breakdown voltage of the portion of the doped region with the uniform depth.

The concept of avalanche breakdown, and the operation of the invention to increase the bias voltage at which avalanche breakdown occurs, is best understood by considering the dynamics of the mobile and immobile charge carriers at the junction under several different bias voltage conditions. With zero reverse bias applied to the junction, each side of the junction has a large number of mobile or free charge carriers. In particular, mobile electrons exist in the conduction band in the N-type material; while mobile holes exist in the valence band in the P-type material. In addition, each side of the junction has a large number of immobile charge carriers which provide a fixed space charge. This space charge is comprised of positive ions in the N-type material, and negative ions in the P-type material.

Also under a zero bias voltage condition, a depletion region exists at the junction. This depletion region is formed by free electrons drifting from the N-type side to the P-type side where they recombine with holes, and by holes drifting from the P-type side to N-type side where they recombine with free electrons. The net effect of this mobile charge annihilation is that both sides of the junction are depleted of free charge. At the same time, the positive immobile charge in the N-type side and the negative immobile charge in the P-type side remain. The area in which this immobile charge exists with no cancelling mobile charge is called the depletion region.

The immobile charge in the depletion region gives rise to an electric field across the junction; and large electric fields cause avalanche breakdown. In particular, the electric field accelerates electrons as they cross from the P-type material to the N-type material. These accelerated electrons collide with other atoms as they pass through the junction. If the accelerating electric field is sufficiently high, the collision ionizes the atom. That is, the collision generates another free electron in the conduction band and a mobile hole in the valence band. The new free electron and the original free electron are then both accelerated and other similar collisions result. The electric field required to produce sufficient acceleration to cause ionization, is called the critical field; and it is approximately $(2-8) \times 10^5$ volts per centimeter in an abrupt junction having a substrate doping of $1.0 \times 10^{15}$ atoms/cm$^3$.

In general, the electric field at any point in the junction is a function of the reverse bias applied to the junction and the junction geometry. A large reverse bias applied to the junction increases the depletion region width, and the size of the electric field increases accordingly. Where the junction is relatively flat, the electric field lines are approximately perpendicular to the junction and thus are parallel to each other. But where the junction has curvature, the electric field lines are also approximately perpendicular to a junction and thus they crowd on the concave side of the junction. Accordingly, the electric field is highest where the junction curvature is greatest. It is in that region that the critical electric field is first reached as the reverse bias is increased, and avalanche breakdown first occurs. A more detailed analysis of electric field line crowding and its effect on avalanche breakdown is described in an article entitled Breakdown Voltage of Cylindrical Gaussian P-N Junctions by Rombeek et al printed in the Solid State Electronics Journal, volume 24, pgs. 1193–1200, June 1971.

The disclosed semiconductor device has a P-N junction provided with a novel structure which greatly reduces electrical field crowding at the perimeter of the doped region. As a result, the disclosed structure has a high avalanche breakdown voltage characteristic. In the prior art, several other structures are described which also reduce electric field crowding at the perimeter of the doped region. But these structures are completely different from the disclosed structure. For example, an article entitled Edge Breakdown in Mesa Diodes by Kelholm et al published in the IEEE Transactions on Electronic Devices, volume 18, No. 10, pgs 844–848, October 1971 describes the structure and operation of a mesa diode. The mesa diode in general, reduces electric field crowding at the perimeter of the doped region by removing a portion of the substrate adjacent to the perimeter of the doped region. For example, the substrate adjacent the perimeter of the doped region is removed by an etching treatment after the doped region is formed.

Another junction structure having a high avalanche breakdown voltage is described in an article entitled The Theory and Application of a Simple Etch Contour for Near Ideal Breakdown Voltage in Plane and Planar P-N Junctions by Temple et al published in the IEEE Tranactions on Electronic Devices volume 23, No. 8, pgs. 950–955 August 1976. The structure therein disclosed achieves increased avalanche breakdown voltage by having a doped region which is etched near its perimeter. That is, the doped region has one thickness near its perimeter and has a greater thickness at its interior.

Still another semiconductor junction having a high avalanche breakdown voltage is described in an article entitled New Semiconductor Devices of Ultra High Breakdown Voltage by Matsushita et al which was published in a technical paper in the International Electron Devices Meeting, pgs. 109–110, in December of 1973. The structure therein described is basically comprised of a semiconductor substrate having a doped region lying therein forming a conventional PN junction, and further including a plurality of doped regions which are spaced apart and surround the first doped region. In the illustrated embodiment, the plurality of doped regions are circular in shape and form concentric rings about a circular conventional doped region.

Still another structure for a junction having a high breakdown voltage is described in an article entitled Effect of Surface Fields on the Breakdown Voltage of Planar or Silicon P-N Junctions by Grove et al printed in the IEEE Tranactions on Electronic Devices volume 14, No. 3, pgs 157-162, March 1967. The structure therein disclosed includes a semiconductor substrate having a doped region lying therein, and further includes a gate electrode which surrounds the perimeter of the doped region. A gate voltage is applied to the gate electrode to thereby generate an electric field in the substrate near the perimeter of the doped region. This generated field counteracts the electric field due to the depletion region and thus reduces field crowding at the perimeter.

However, all of these prior art structures are totally different than the disclosed structure. It is therefore an object of the invention to provide a new and non-obvious semiconductor junction structure having a high avalanche breakdown voltage.

SUMMARY OF THE INVENTION

These and other objectives are accomplished in accordance with the invention by providing a semiconductor device having a P-N junction, wherein the semiconductor device is comprised of a semiconductor substrate having impurity atoms of one type and having a first surface. A first doped region lies in the substrate at the first surface. The first doped region has dopant impurity atoms of the type opposite to said one type. A second doped region lies in the substrate at the first surface adjacent to the entire perimeter of the first doped region. The second doped region extends laterally away from the first doped region, and has dopant atoms of the same type and of less density than the dopant atoms of the first doped region. Under a high reverse bias potential, the second doped region completely depletes or "pinches off". The electric field generated by the immobile charges in the fully depleted second doped region operates to greatly reduce electric field crowding at the perimeter of the first doped region. Variations of this basic structure are also disclosed.

BRIEF DESCRIPTION OF THE DRAWINGS

The novel features believed characteristic of the invention are set forth in the appended claims; the invention itself, however, as well as other features and other advantages thereof, may best be understood by referring to the following detailed description of particular embodiments when read in reference to the accompanying drawings, wherein:

FIG. 4 is a greatly enlarged cross-sectional view of a fourth embodiment of the invention with the depletion region and electric field lines illustrated thereon for a breakdown voltage condition;

FIG. 5 is a greatly enlarged cross-sectional view of a fifth embodiment of the invention with the depletion region and electric field lines illustrated thereon for two reverse bias voltage conditions; and FIG. 6 is a greatly enlarged cross-sectional view of a sixth embodiment of the invention with the depletion region and electric field lines illustrated thereon for two reverse bias voltage conditions.

DETAILED DESCRIPTION

The structure and operation of one embodiment of a semiconductor device having a P-N junction constructed according to the invention will now be described in conjunction with FIGS. 1a-1c. These FIGURES are greatly enlarged cross-sectional views of the semiconductor device, with the width of the depletion region of the junction illustrated thereon for three different reverse bias potentials.

Figure 1A:
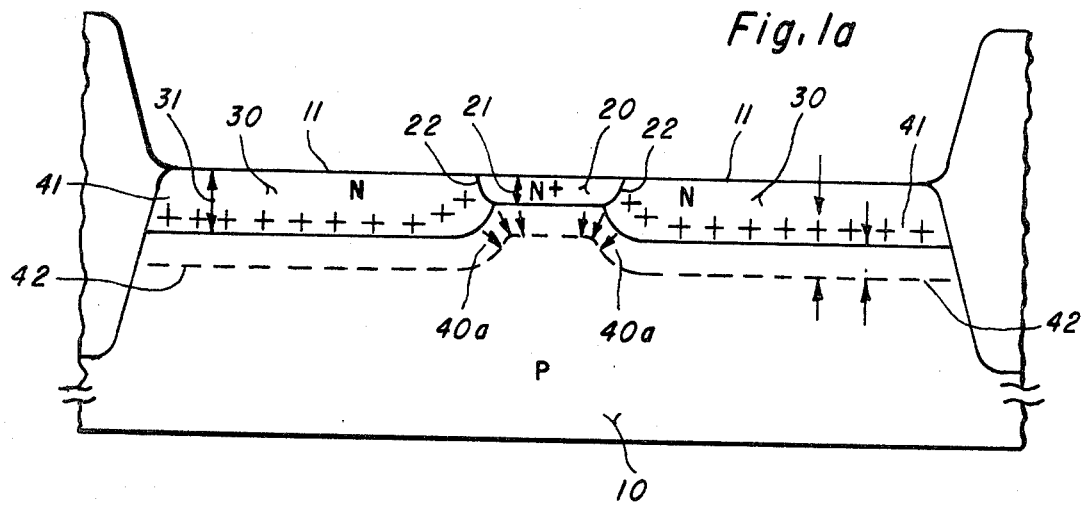
FIGS. 1a-1c are greatly enlarged cross-sectional views of a semiconductor device having a P-N junction constructed according to the invention with the junction depletion region and electric field lines illustrated thereon for three different reverse bias potentials.

In particular, FIG. 1a illustrates the junction structure and depletion region width of the semiconductor device when zero bias voltage is applied. As therein illustrated, the semiconductor device includes a semiconductor substrate 10 having a first surface 11. Substrate 10 has dopant impurity atoms of one type which may be either P type or N type. In FIG. 1a, substrate 10 is illustrated as having P type dopant atoms as an example. Suitably, the density of these atoms in substrate 10 is $1.0 \times 10^{15}$ atoms per centimeter 3.

A first doped region 20 lies in substrate 10 at surface 11. Region 20 has a depth 21 of approximately 0.1u-1.0u. Region 20 also has a curved perimeter 22 which extends from surface 11 into substrate 10 to the depth 21. The radius of curvature of perimeter 22 is roughly equal to the depth 21.

Region 20 has a top view profile along surface 11 which may be any one of several different shapes. For example, it may be round or rectangular. But regardless of the top view profile of region 20, perimeter 22 has the above-described curved shape along any particular cross-sectional cut.

Dopant atoms of a type opposite to the dopant atoms of substrate 10 lie throughout region 20. The density of these atoms is relatively large. Suitably, region 20 has an impurity density of $1.0 \times 10^{20}$ atoms per centimeter 3. The doping type and density of region 20 is indicated in FIG. 1a by the symbol N+.

A second doped region 30 lies in substrate 10 at surface 11. Region 30 is adjacent to the entire perimeter 22 of the first doped region 20. Also, region 30 extends laterally away from the first doped region 20 by a distance which is several times greater than depth 21. In a preferred embodiment, this lateral distance is at least twice the width of the depletion region in substrate 10 under region 20 when region 30 is fully depleted by a reverse bias voltage.

Region 30 has a depth 31 which extends into substrate 10 beyond region 20. Suitably, depth 31 is 0.1u-5.0u greater than the depth of region 20. Dopant impurity atoms lie throughout region 30. These are of the same type and of less density than the dopant atoms of the first doped region 20. A density of $1.0 \times 10^{15}$ impurity atoms per centimeter 3 is suitable within region 30 as an example.

The manner in which the above described junction structure operates to have a high avalanche breakdown voltage will now be described. This is best understood by considering the shape of the depletion region at the junction of regions 20 and 30 with substrate 10 under various reverse bias voltage conditions. In FIG. 1a, plus signs 41 and minus signs 42 indicate this shape under the condition when zero bias voltage is applied to region 20. The plus signs 41 represent immobile positive charges in region 30 which remain after free electrons are repelled away from the junction of region 30 with substrate 10. Similarly, the minus signs 42 represent immobile negative charges which remain in substrate 10 after mobile holes are repelled away from the junction of substrate 10 with regions 20 and 30.

Under zero reverse bias voltage conditions, the depleted portion of region 30 has a width 43; while the depleted portion of substrate 10 has a width 44. Widths 43 and 44 are approximately constant and follow the profile of the junction between substrate 10 and regions 20 and 30. Thus, the depleted region in substrate 10 has no curvature directly under regions 20 and 30; but does have curvature near the interface of regions 20 and 30. This curvature gives rise to electric field crowding in the corresponding substrate area. The crowding is illustrated by electric field lines 40a, under zero reverse bias condition. However, this crowding is nowhere near sufficient to cause avalanche breakdown, and thus is perfectly acceptable.

Figure 1B:
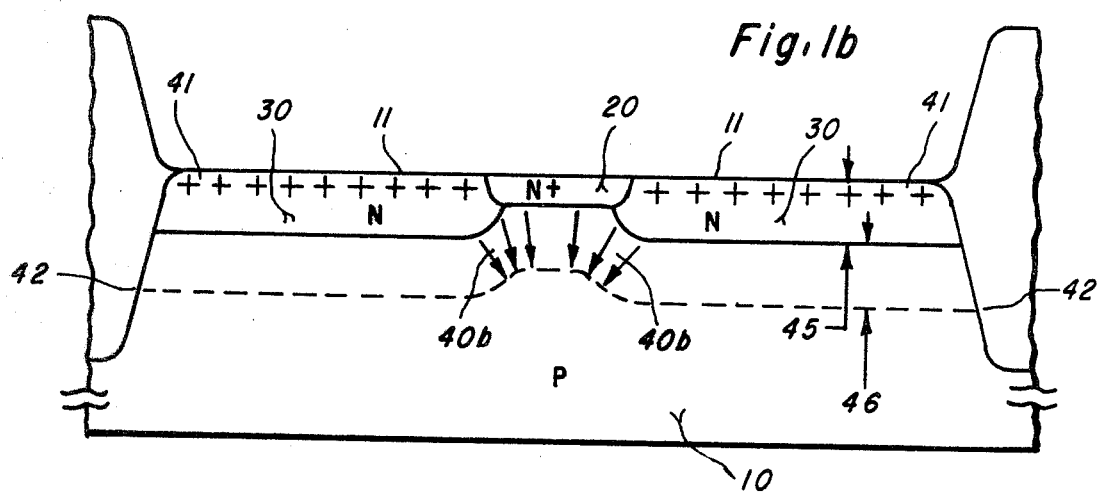

Referring now to FIG. 1b, the width of the depleted portions of substrate 10 and regions 20 and 30 are illustrated for the condition where a reverse bias voltage is applied to region 20. The effect of the reverse bias voltage is to increase the width of the depleted portion of region 30 and substrate 10 to widths 45 and 46 respectively. Again, widths 45 and 46 are approximately constant and follow the profile of the junction between substrate 10 and regions 20 and 30. However, the effect of the increased width is to slightly decrease the amount of curvature of the depleted portion of substrate 10. Thus, the crowding of the electric field lines in substrate 10 at the interface of regions 20 and 30 is reduced. This is illustrated by electric field lines 40b in FIG. 1b.

Figure 1C:
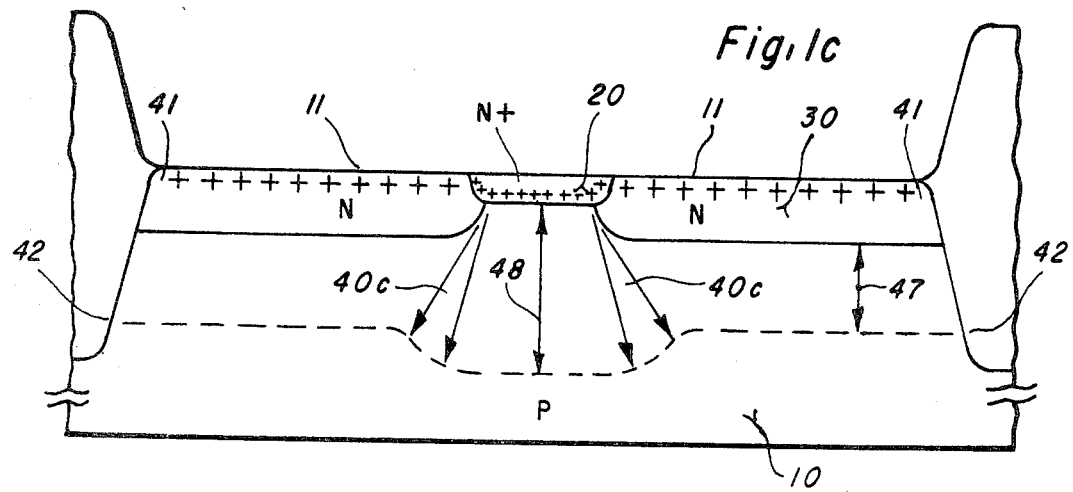

The effect of applying an even greater reverse bias voltage to region 20 is illustrated in FIG. 1c. Under the conditions therein illustrated, region 30 is completely depleted or "pinched off". As a result, the width of the depletion region in substrate 10 is no longer approximately constant. Instead, the width of the depletion region in substrate 10 directly under region 30 has one width 47, while the depletion region directly under region 20 has a greater width 48. Width 48 is greater than width 47 because both widths are proportional to the amount of immobile charge in the overlying regions 20 and 30 respectively.

As a result of the different depletion widths 47 and 48, electric field crowding occurs in substrate 10 near the junction between regions 20 and 30. This is illustrated by electric field lines 40c. The amount of field crowding increases as the reverse bias voltage is increased; and eventually, avalanche breakdown occurs where the field crowding is the greatest. However, the reverse bias voltage which causes avalanche breakdown in the disclosed structure is substantially, greater than the reverse bias breakdown voltage for conventional structures which have no second doped region 30. This is because the electric field generated by depleted dopant atoms in region 30 acts to reduce the crowding of field lines at perimeter 22 under high reverse bias voltage conditions. As pointed out above, the FIG. 1 embodiment actually causes the electric field lines to be dispersed at perimeter 22 under zero reverse bias voltage; and thus electric field line crowding does not ever begin to occur at perimeter 22 until some relatively high reverse bias voltage is applied to region 20.

Breakdown values of 75 to 120 volts have been experimentally verified in the structure of FIG. 1; and even greater breakdown voltages are achievabl through optimization of geometries and implant dosages. In comparison, breakdown voltages of 28 to 64 volts are typical for the same $N+ - P$ junction without the second doped region 30.

Figure 2A:
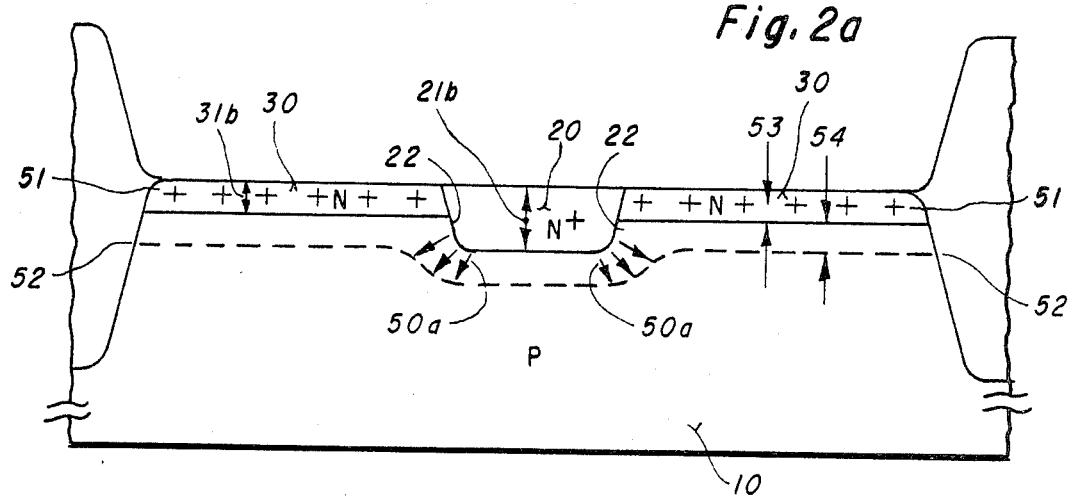
FIGS. 2a-2b are greatly enlarged cross-sectional views of a second embodiment of the invention with the depletion region and electric field lines illustrated thereon for two different reverse bias potentials.
Figure 2B:
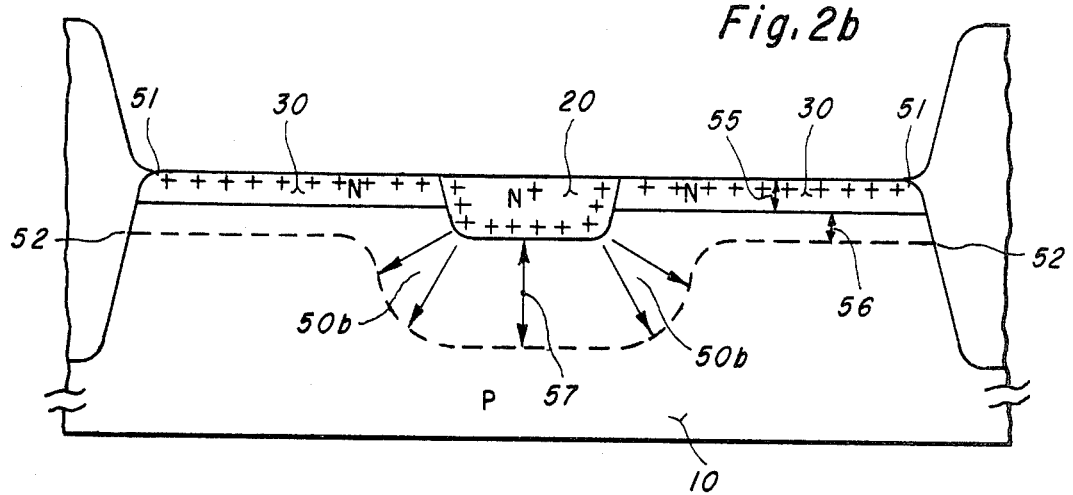

Referring now to FIGS. 2a–2b, greatly enlarged cross-sectional views of a second embodiment of the invention, and the operation thereof, are illustrated. The structure of FIG. 2 is similar to the structure of FIG. 1; and the similar portions are labeled with the same reference numerals. For example, both embodiments include a substrate 10, having a first surface 11 with dopant regions 20 and 30 lying therein. Also, the type and density of the dopant atoms in substrate 10 and regions 20 and 30 are approximately the same for both the FIG. 1 and FIG. 2 embodiments.

The main difference between the embodiment of FIGS. 1 and 2 is the relative depths of regions 20 and 30. In the FIG. 1 embodiment, the depth of region 20 is less than the depth of region 30; whereas in the FIG. 2 embodiment, the depth of region 20 is greater than the depth of region 30. This difference greatly effects the avalanche breakdown voltage, as is described below. Suitably, in the FIG. 2 embodiment, region 30 has depth 31b of 0.1u–10.0u; and region 20 has a depth 21b which is 0.1u–5.0u greater than depth 31b.

The manner in which electric field lines crowd to cause breakdown near the junction of regions 20 and 30 with increasing reverse bias voltage will now be described. These field lines are indicated at 50a and 50b in FIGS. 2a and 2b respectively. In addition, plus signs 51 indicate the width of the depleted portions of regions 20 and 30; while minus signs 52 indicate the width of the depleted portion of substrate 10.

FIG. 2a illustrates the field lines and depletion regions under the condition when zero reverse bias voltage is applied. Under this condition, the depleted portion of region 30 has a width 53 whereas the depleted portion of substrate 10 has a width 54. Widths 53 and 54 are relatively constant. Thus, no electric field crowding occurs directly under regions 20 and 30; while some electric field crowding occurs at the interface of regions 20 and 30 due to the curvature of perimeter 22. Field lines 50a indicate this crowding in the areas where avalanche breakdown will eventually occur when a higher reverse bias voltage is applied. Note that field lines 50a do not disperse at this point, as they did in the FIG. 1 embodiment. The amount of crowding is somewhat decreased over a conventional $N+P$ junction however, by an electric field component due to the partially depleted region 30.

FIG. 2b illustrates the widths of the depletion regions under the condition where a reverse bias breakdown voltage is applied. As therein illustrated, region 30 is fully depleted and has a depletion width 55. Accordingly, substrate 10 directly under region 30 is depleted to a relatively constant width 56. By comparison, the substrate region directly under region 20 is depleted to a depth 57 which is greater than the depth 56. As a result of the difference in depths 56 and 57, the field lines 50b are concentrated or crowded closer together at perimeter 22 which causes avalanche breakdown. However, the fully depleted region 30 near perimeter 22 reduces field crowding in that area. As a result, the structure of FIG. 2 has a breakdown voltage intermediate between the breakdown voltage of a conventional N+ − P junction and the structure of FIG. 1.

Figure 3:
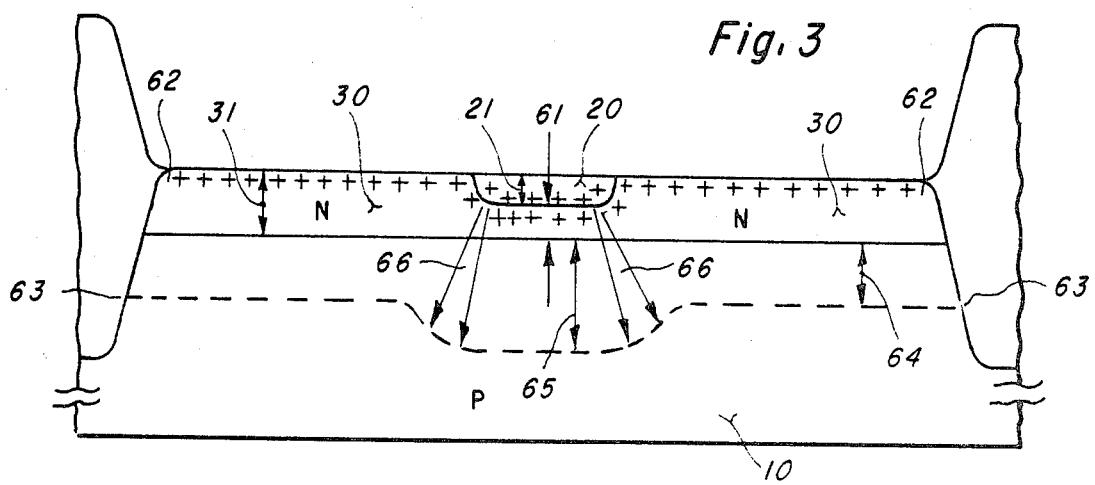
FIG. 3 is a greatly enlarged cross-sectional view of a third embodiment of the invention with the depletion region and electric field lines illustrated thereon for a breakdown bias condition.

Another embodiment of the invention is illustrated in the cross-sectional view of FIG. 3. This embodiment is also similar in structure to the embodiment of FIG. 1; and like reference numerals indicate the similar portions. The main difference between the FIG. 3 structure and the FIG. 1 structure is that in the former, doped region 30 extends within substrate 10 to completely underlie doped region 20. The depth to which region 30 extends below region 20 is indicated at 61. Suitably, depth 61 is between 0.1 u–5u.

The operation of the FIG. 3 embodiment, is best understood by considering the profile of the depleted portions of substrate 10 and regions 20 and 30 under a reverse bias breakdown voltage condition. This profile is indicated by plus signs 62 and minus signs 63 in FIG. 3. As is therein illustrated, under a reverse bias breakdown voltage condition, region 30 is completely depleted, or "pinched-off", and thus the underlying substrate region has a relatively constant depletion width 64. At the same time, the depleted portion of substrate 10 which underlies region 20 has a depletion width 65 that is greater than depletion width 64. This is because the electric field in that region is formed by depleted impurity atoms in both regions 20 and 30; and region 20 is not pinched off. As a result of the different widths 64 and 65, electric field lines 66 crowd near perimeter 22 as indicated in FIG. 3. However, the amount of crowding is substantially reduced over that in the FIG. 1 embodiment because the depth 61 acts to smooth the curvature of perimeter 22. This is evident since the distance over which a particular reverse bias voltage is dropped across the junction is increased by the depth 61. This results in a reduced electric field, sice an electric field is proportional to the voltage dropped across a distance divided by that same distance. Accordingly, the avalanche breakdown voltage of the structure of FIG. 3 is even greater than the breakdown voltage of the FIG. 1 embodiment.

Referring now to FIG. 4, still another embodiment of the invention is illustrated in greatly enlarged cross-sectional view. The FIG. 4 embodiment is similar in structure to the preceding embodiments, and similar portions are indicated with like reference numerals. The main difference of the embodiment of FIG. 4 is that doped region 30 is comprised of a relatively deep layer 71 of dopant atoms, and an overlying relatively shallow layer 72 of dopant atoms. For example, layer 71 has a depth 73 of approximately 0.1u–5.0u; while layer 72 has a depth 74 of 100A°–500A°. The charge density of dopant atoms in layer 71 is substantially less than the charge density of dopant atoms in layer 72. For example, layers 71 and 72 have charge densities of 1.0×10$^{15}$ and 1.0×10$^{20}$ dopant atoms per centimeter respectively.

Electric field crowding near perimeter 22 under a high reverse bias voltage condition is substantially reduced by the structure of FIG. 4; and the avalanche breakdown voltage is accordingly increased. This is evident by considering the profile of the depletion regions in FIG. 4 under a high reverse bias voltage condition. Plus signs 75 indicate the depletion region profile in doped regions 20 and 30, while minus signs 76 indicate the depletion region profile in substrate 10. As the illustrated profile indicates, a portion of the highly doped shallow layer 72 depletes under a high reverse bias voltage condition. Accordingly, the magnitude of the electric field directly under region 30 is not limited by the amount of immobile charge within region 71 after it has fully depleted. That is, the electric field directly under region 30 continuous to grow after region 71 fully depletes at approximately the same rate as the electric field directly under region 20 grows. The rate of electric field growth under layer 72 will decrease however, as the lateral distance from region 20 increases. This is because layer 72 has a high sheet resistance due to its geometry and doping level. As a result, there is a voltage drop laterally along layer 72. Because of this, the depletion region in substrate 10 under perimeter 22 still has curvature, but it is greatly reduced (as compared to the FIG. 2 structure for example). And since the curvature is reduced, electric lines 77 have less crowding at perimeter 22 which in turn gives rise to increased avalanche breakdown voltage.

Another embodiment of the invention is illustrated in cross-sectional view in FIG. 5. This embodiment differs from the previously described embodiments in that the density of the dopant atoms in region 30 is graded to decrease as the lateral distance from doped region 20 increases. In particular, the dopant density of region 30 consists of a plurality of discrete dopant levels. Plus signs 81–84 indicate these discrete dopant levels as an example. That is, plus signs 81–84 show the width of the depleted portions of region 30 under a zero reverse bias voltage condition, and as illustrated these depletion widths increase in discrete steps as the lateral distance from the doped region 20 increases. This is because the width of a depleted region varies inversely proportional to the impurity atom density of that region.

The structure of FIG. 5 operates to have reduced electric field crowding near perimeter 22 under a high reverse bias voltage condition, while at the same time, having a relatively small electric field at the outer lateral boundary of region 30. This is of particular importance, for example, when the outer lateral boundary of region 30 is defined by a heavily doped region of the same type dopant atoms as the substrate. Channel stop regions, such as are indicated at 86 in FIG. 5, commonly are constructed this way. The existence of channel stop regions 86 creates the possibility of avalanche breakdown occurring at the junction of region 30 and a respective channel stop 86 before breakdown occurs at perimeter 22. But this possibility is eliminated in the FIG. 5 embodiment by the decreased dopant density of region 30 near each of the channel stops 86, since breakdown voltage for a one sided abrupt junction varies inversely proportional to the dopant charge density of the depleted side. Minus signs 87 illustrate the profile of the depleted portion of substrate 10 under a zero reverse bias voltage condition, while minus signs 88 illustrate this profile under a large reverse bias voltage condition. Clearly, the latter has reduced curvature near perimeter 22. Thus the structure of FIG. 5 has a relatively high breakdown voltage.

FIG. 6 illustrates in cross-sectional view still another embodiment of the invention. This embodiment is similar to that illustrated in FIG. 5 in that the charge density of region 30 varies inversely proportional to the lateral distance away from region 20. In the FIG. 6 embodiment however, the charge density in region 30 varies approximately linearly with the lateral distance from region 20. Plus signs 91 indicate this linearly varying charge density by representing the depletion width of region 30 under a zero reverse bias voltage condition. The actual dopant charge density may vary, for example, from a high of $1.0 \times 10^{18}$ atoms per centimeter$^3$ to a low of $1.0 \times 10^{15}$ atoms per centimeter$^3$.

Minus signs 92 and 93 illustrate the profile of the depleted portion of substrate 10 under a zero reverse bias and a large reverse bias respectively. These profiles are similar to those indicated by minus signs 87 and 88 of FIG. 5. The reduced curvature of the depletion region in substrate 10 again gives rise to a high breakdown voltage.

Various embodiments of the invention have now been described in detail. Many changes and modifications can be made in the above details without departing from the nature and spirit of the invention. For example, the graded doping described in conjunction with FIGS. 5 and 6 may be utilized with any of the embodiments of FIGS. 1–4. Also, layer 71 of the FIG. 4 embodiment may extend laterally away from region 20 and terminate after only partially covering region 30. Therefore, it is understood that the invention is not to be limited to said details except as set forth in the appended claims.

What is claimed is:

1. A semiconductor device having a p-n junction characterized by low electric field crowding and a resulting high avalanche breakdown voltage requirement comprising:
   a semiconductor substrate having dopant impurity atoms of one type conductivity and a first surface;
   a first doped region in said substrate at said first surface and having dopant impurity atoms of a second type conductivity opposite to said one type conductivity of said substrate;
   a second doped region in said substrate at said first surface and having dopant impurity atoms of said second type conductivity but of less density than the dopant impurity atoms of said first doped region, said second doped region bounding the entire lateral perimeter of said first doped region in contiguous relation thereto and extending laterally outwardly from said first doped region along said first surface of said substrate; and
   said second doped region being depleted in response to the application of a reverse bias voltage to said first doped region to reduce electric field crowding along the depth-defining boundary of said first doped region, whereby the magnitude of the reverse bias voltage applied to said first doped region which is required to produce avalanche breakdown is increased.

2. A semiconductor device as set forth in claim 1, wherein said one type conductivity dopant impurity atoms are P-type, and said second type conductivity dopant impurity atoms are N-type.

3. A semiconductor device as set forth in claim 1, wherein said one type conductivity dopant impurity atoms are N-type, and said second type conductivity dopant impurity atoms are P-type.

4. A semiconductor device as set forth in claim 1, wherein said second doped region extends laterally outwardly from said first doped region by a distance of at least twice the width of the depletion region in said substrate under said first doped region when said second doped region is fully depleted in response to the application of a reverse bias voltage to said first doped region.

5. A semiconductor device as set forth in claim 1, wherein the depth of said first doped region within said substrate is shallower than the depth of said second doped region within said substrate.

6. A semiconductor device as set forth in claim 1, wherein the depth of said first doped region within said substrate is greater than the depth of said second doped region within said substrate.

7. A semiconductor device as set forth in claim 1, wherein the depth-defining boundary of said first doped region is in direct contact with the underlying portion of said substrate free from said second doped region.

8. A semiconductor device as set forth in claim 7, wherein the depth of said first doped region within said substrate is shallower than the depth of said second doped region within said substrate.

9. A semiconductor device as set forth in claim 7, wherein the depth of said first doped region within said substrate is greater than the depth of said second doped region within said substrate.

10. A semiconductor device as set forth in claim 1, wherein said second doped region has a depth greater than that of said first doped region and includes a portion extending beneath said first doped region in contiguous underlying relationship therewith so as to be interposed between said first doped region and the portion of said substrate thereunder.

11. A semiconductor device as set forth in claim 1, wherein said second doped region comprises a first relatively deep zone having dopant impurity atoms of said second type conductivity of a predetermined density, and a second shallow zone overlying said first relatively deep zone and having dopant impurity atoms of said second type conductivity of a greater density than the predetermined density of said dopant impurity atoms in said first relatively deep zone of said second doped region.

12. A semiconductor device as set forth in claim 1, wherein said second doped region has a graded density of dopant impurity atoms of said second type conductivity in which the density of said dopant impurity atoms of said second type conductivity decreases as the lateral distance that said second doped region extends from said first doped region increases.

13. A semiconductor device as set forth in claim 12, wherein said graded density of dopant impurity atoms of said second type conductivity is defined by a plurality of discrete different dopant levels forming said second doped region.

14. A semiconductor device as set forth in claim 12, wherein said graded density of dopant impurity atoms of said second type conductivity of said second doped region is linearly graded in a decreasing manner as the lateral distance that said second doped region extends from said first doped region increases.

* * * * *